United States Patent
Wu et al.

(10) Patent No.: US 8,525,146 B2
(45) Date of Patent: Sep. 3, 2013

(54) ELECTRICAL CIRCUIT COMPONENT

(75) Inventors: Wei Wu, Palo Alto, CA (US); Matthew D. Pickett, San Francisco, CA (US); Jianhua Yang, Palo Alto, CA (US); Qiangfei Xia, Palo Alto, CA (US); Gilberto Medeiros Ribeiro, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 241 days.

(21) Appl. No.: 12/961,214

(22) Filed: Dec. 6, 2010

(65) Prior Publication Data

US 2012/0138885 A1    Jun. 7, 2012

(51) Int. Cl.
*H01L 47/00*    (2006.01)
*H01L 21/326*    (2006.01)
*H01L 21/479*    (2006.01)

(52) U.S. Cl.
USPC ............. 257/5; 257/E21.327; 257/E29.068; 438/466

(58) Field of Classification Search
USPC ............. 257/5, E21.327, E29.068; 438/466
See application file for complete search history.

(56) References Cited

U.S. PATENT DOCUMENTS

| | | | |
|---|---|---|---|
| 5,312,684 A | 5/1994 | Michael et al. | |
| 6,271,544 B1 | 8/2001 | Fang et al. | |
| 6,724,655 B2 | 4/2004 | King | |
| 6,990,016 B2 * | 1/2006 | King | 365/176 |
| 7,009,278 B2 * | 3/2006 | Hsu | 257/536 |
| 7,221,005 B2 * | 5/2007 | Ogura et al. | 257/192 |
| 7,491,968 B2 * | 2/2009 | Kang et al. | 257/40 |
| 7,791,376 B2 | 9/2010 | Lim et al. | |
| 2008/0089121 A1 | 4/2008 | Aochi et al. | |
| 2008/0224120 A1 | 9/2008 | Czubatyj et al. | |
| 2010/0034011 A1 * | 2/2010 | Xi et al. | 365/148 |

FOREIGN PATENT DOCUMENTS

WO    2010068221 A1    6/2010

* cited by examiner

*Primary Examiner* — David S Blum

(57) ABSTRACT

An electrical circuit component includes a first electrode, a plurality of second electrodes and a negative differential resistance (NDR) material. The first electrode and the plurality of second electrodes are connected to the NDR material and the NDR material is to electrically connect the first electrode to one of the plurality of second electrodes when a sufficient voltage is applied between the first electrode and the one of the plurality of second electrodes through the NDR material.

21 Claims, 4 Drawing Sheets

ELECTRICAL CIRCUIT COMPONENT

BACKGROUND

Electronic circuits typically include many electronic switches. Most of the electronic switches use field effect transistors (FETs), connected in series, or for very high frequency and broadband applications, metal, semiconductor field effect transistors (MESFET). In addition, most electronic switches use diodes connected in series with a control port. However, the use of diodes and FETs results in relatively long switching times of the electronic switches. In addition, conventional electronic switches typically require relatively complex fabrication techniques.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1A:
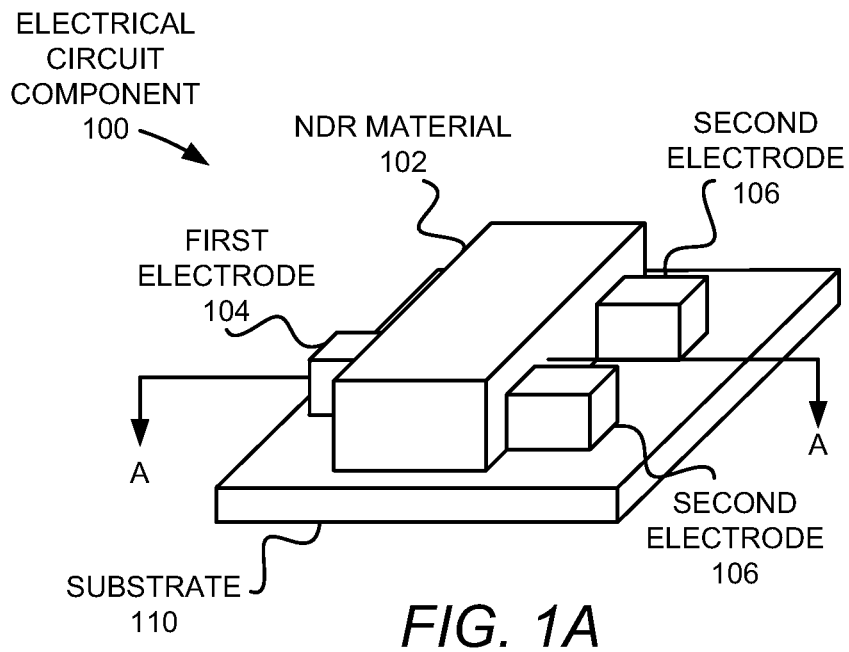
FIG. 1A illustrates a perspective view of an electrical circuit component, according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the term "includes" means includes but not limited to, the term "including" means including but not limited to. The term "based on" means based at least in part on.

Disclosed herein are electrical circuit components and electrical devices that include the electrical circuit components. Also disclosed herein is a method of controlling electrical connections in the electrical circuit components and the electrical devices. The electrical circuit components include a first electrode and a plurality of second electrodes that may selectively be electrically connected to each other through a negative differential resistance (NDR) material. More particularly, the NDR material is to selectively control the electrical connections between the first electrode and the second electrodes depending upon which of the second electrodes a voltage is applied from the first electrode or vice versa.

Generally speaking, the electrical circuit components and electrical devices disclosed herein are relatively easier to fabricate than conventional transistor-based components. In addition, the electrical circuit components and electrical devices disclosed herein are able to perform switching almost instantaneously with the application of a voltage across the NDR material(s) and are thus able to operate at substantially faster rates as compared with conventional transistor-based switches, routers, and multiplexers.

Micron-scale dimensions refer to dimensions that range from 1 micrometer to a few hundred micrometers in size.

For the purposes of this application, nanometer scale or nano-scale dimensions refer to dimensions ranging from 1 to 100 nanometers.

Throughout the present disclosure, the term "n" following a reference numeral is intended to denote an integer value that is greater than 1. In addition, the terms "a" and "an" are intended to denote at least one of a particular element.

With reference first to FIG. 1A, there is shown a perspective view of an electrical circuit component 100, according to an example. It should be understood that the electrical circuit component 100 depicted in FIG. 1A may include additional components and that some of the components described herein may be removed and/or modified without departing from a scope of the electrical circuit component 100. It should also be understood that the components depicted in FIG. 1A are not drawn to scale and thus, the components may have different relative sizes with respect to each other than as shown therein. Thus, for instance, the negative differential resistance (NDR) material 102 may be significantly smaller or larger than the first electrode 104 and/or second electrodes 106 as compared with their relative sizes shown in FIG. 1A.

As depicted in FIG. 1A, the electrical circuit component 100 includes an NDR material 102, a first electrode 104, a pair of second electrodes 106, and a substrate 110. The NDR material 102 is depicted as being positioned between the first electrode 104 and the pair of second electrodes 106. Alternatively, however, one or both of the second electrodes 106 may be positioned on the same side of the NDR material 102 as the first electrode 104 or on a side of the NDR material 102 that is adjacent to the side of on which the first electrode 104 is located without departing from a scope of the electrical circuit component 100. As another alternative, the NDR material 102 may comprise other shapes, such as, a circular shape, a triangular shape, a square shape, a hexagonal shape, etc., and the second electrodes 106 may be attached to any of the sides of the NDR material 102. As a yet further alternative, the NDR material 102 may comprise a plurality of discontinuous elements. For instance, the NDR material 102 may comprise individual strips of material respectively extending between the first electrode 104 and the second electrode 106s.

The electrical circuit component 100 may be built at the micro-scale or nano-scale and may be used as a component in a wide variety of electronic circuits, such as, a switch, a router, a multiplexer, a shifter, etc. The electrical circuit component 100 disclosed herein may also find use in a wide variety of other applications. In the example depicted in FIG. 1A, the electrical circuit component 100 comprises a "Y-switch".

The NDR material 102 may be formed of any suitable material in which a conductive channel is formed between the first electrode 104 and one of the second electrodes 106 when a voltage exceeding a threshold voltage is applied between the first electrode 104 and the one of the second electrodes 106. The NDR material 102 may also be formed of a suitable material in which the conductive channel is removed when the voltage falls below a second threshold voltage and thus exhibits little or no hysteresis following removal of the voltage. In addition, the NDR material 102 includes a material that undergoes a metal-insulator transition. Examples of suitable materials for the NDR material 102 comprise various metal oxide thin films, for instance, vanadium oxide, titanium oxide, manganese oxide, aluminum oxide, niobium oxide, tungsten oxide, etc.

The electrodes 104, 106 may be formed of any of a variety of conducting materials, including, but not limited to metals, metal alloys, highly doped semiconductors, composite materials, nanostructure materials, or other suitable materials. According to an example, the electrodes 104, 106 are formed of platinum. The electrodes 104, 106 may also have a variety of cross-sectional shapes, such as, circular, triangular, hexagonal, etc. In addition, the substrate 110 may be formed of any of a variety of generally insulative materials, such as, plastic, glass, paper, silicon (Si), and type III-V materials, such as, but not limited to silicon (Si), gallium arsenide (GaAs), indium phosphide (InP), etc.

According to an example, the electrical circuit component 100 may be fabricated through any suitable thin film fabrication process. For instance, a metal insulator transition oxide material may be deposited onto the substrate 110 through sputtering to form the NDR material 102, and the electrodes 104, 106 may be formed through a patterning process. In this regard, the electrical circuit component 100 may be fabricated through relatively simple and inexpensive fabrication techniques.

Figure 1B:
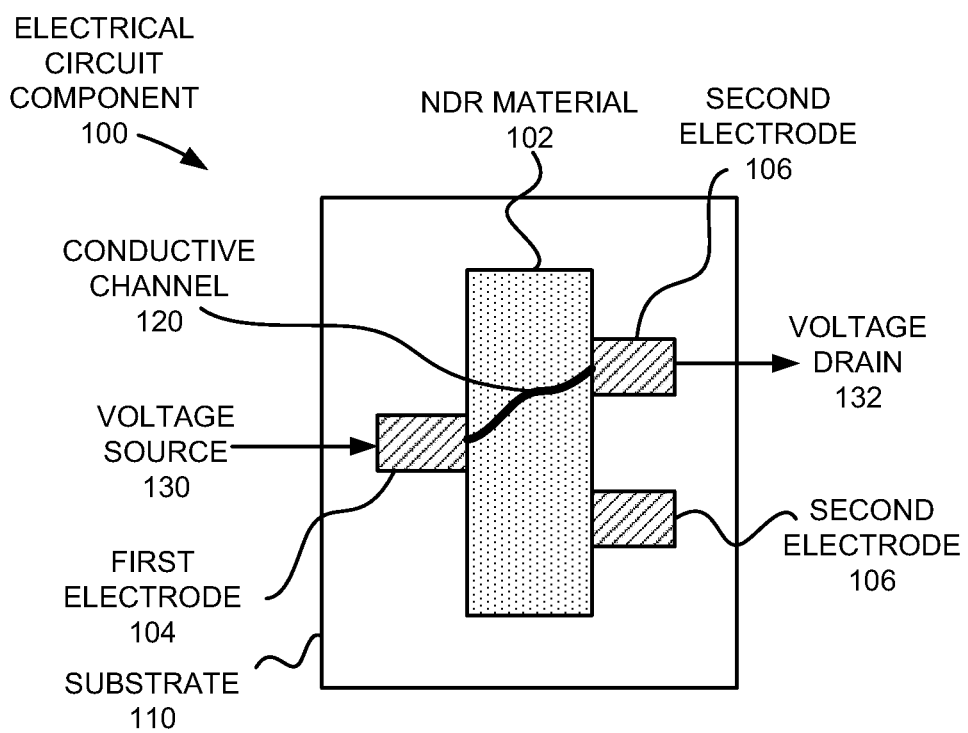
FIG. 1B illustrates a cross-sectional top view of the electrical circuit component taken along line A-A in FIG. 1A, according to an example of the present disclosure.

With reference now to FIG. 1B, there is shown a cross-sectional top view of the electrical circuit component 100 taken along line A-A in FIG. 1A, according to an example. As shown therein, a conductive channel 120 is formed in the NDR material 102 when a voltage is applied through the first electrode 104 and one of the second electrodes 106 between a voltage source 130 and a voltage drain 132. Generally speaking, the material forming the NDR material 102 exhibits a threshold instability or current controlled negative differential resistance. More particularly, the NDR material 102 provides a generally resistive connection between the first electrode 104 and the second electrodes 106 when there is little or no current (or voltage) applied through the NDR material 102 between the first electrode 104 and the second electrodes 106. However, when a certain threshold current (or threshold voltage (Vt) 202) is applied between the first electrode 104 and a second electrode 106, an instability in the NDR material 102 causes the local conductive channel 120 to form between the first electrode 104 and the second electrode 106.

Figure 2:
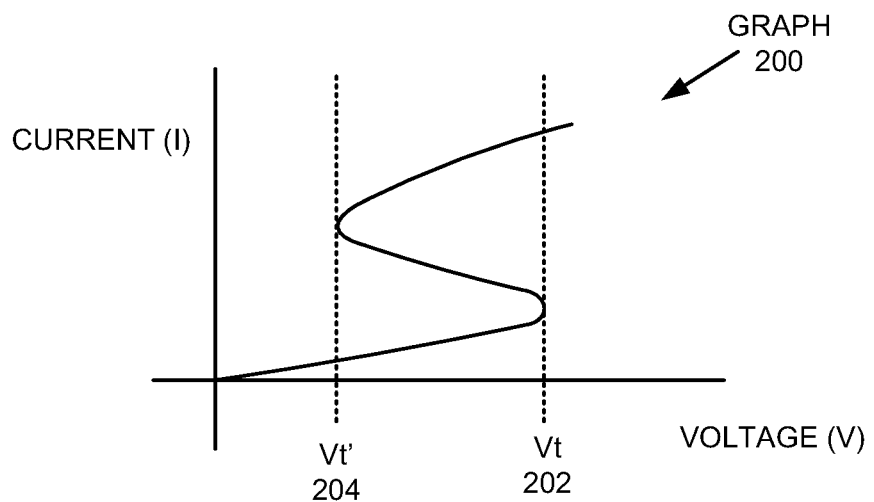
FIG. 2 shows a graph of the relationship between current and voltage through a negative differential resistance (NDR) material, according to an example of the present disclosure.

With reference now to FIG. 2, there is shown a graph 200 of the relationship between current and voltage through a NDR material 102, according to an example. As shown therein, the relationship between the current and voltage through the NDR material 102 follows an "S" shape and thus, the NDR material 102 comprises an S-NDR. The conductive channel 120 is formed, and thus, the first electrode 104 is electrically connected to the second electrode 106, when the voltage applied between the first electrode 104 and the second electrode 106 is at or exceeds a first predetermined threshold voltage (Vt) 202. In this regard, the connection is construed to be "on" when the conductive channel 120 is formed between the first electrode 104 and the second electrode 106. As also shown in the graph 200, as the current is increased following Vt 202, the voltage is reducing because the NDR material 102 is getting more conductive as the current is increased until a certain point, the second threshold voltage (Vt') 204, where the increase in current also results in an increase in voltage.

In addition, if the voltage is reduced below the second predetermined threshold voltage (Vt') 204, the conductive channel 120 begins to disappear and the electrical connection between the first electrode 104 and the second electrode 106 is removed. In this regard, the connection is construed to be "off" between the first electrode 104 and a second electrode 106. Thus, a relatively stable electrical connection may be maintained between the first electrode 104 and a second electrode 106 so long as the voltage applied between the first electrode 104 and the second electrode 106 remains between the first predetermined threshold voltage 202 and the second predetermined threshold voltage 204.

The conductive channel 120 may selectively and repetitively be formed and removed between the first electrode 104 and the second electrodes 106 through application of the appropriate voltage between the first electrode 104 and the second electrodes 106. In addition, the first predetermined threshold voltage 202 and the second predetermined threshold voltage 204 may depend upon the one or more materials contained in the NDR material 102.

Figure 1C:
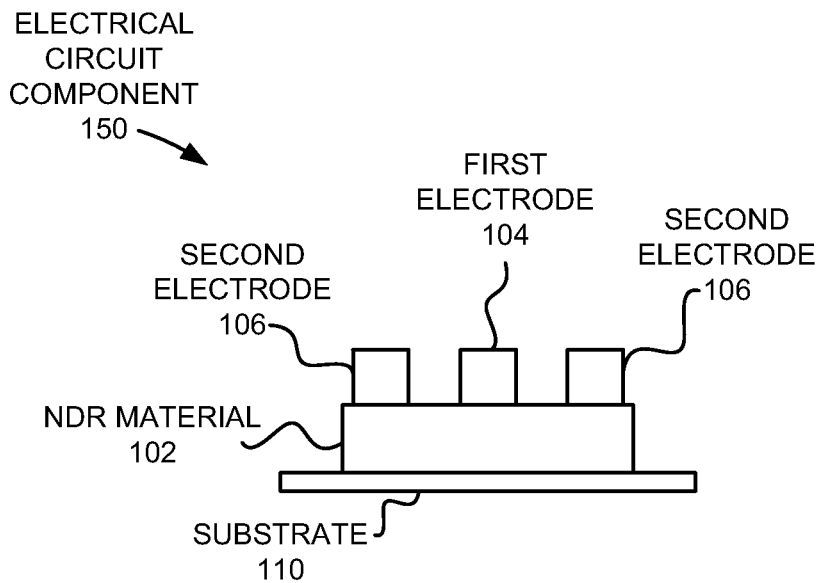
FIG. 1C illustrates a side view of an electrical circuit component, according to another example of the present disclosure.

Turning now to FIG. 1C, there is shown a side view of an electrical circuit component 150, according to another example. The electrical circuit component 150 includes all of the same elements as the electrical circuit component 100 depicted in FIGS. 1A and 1B. As such, a detailed discussion of those common elements is not repeated herein with respect to FIG. 1C. Instead, as shown in FIG. 1C, the relative positions of the electrodes 104 and 106 and the NDR material 102 have been modified from their positions in FIGS. 1A and 1B. More particularly, the NDR material 102 is depicted as being positioned directly on the substrate 110, with the first electrode 104 and the second electrodes 106 being positioned on top of the NDR material 102. It should be understood that alternative arrangements are also possible within the scope of the electrical circuit component 100, 150 disclosed herein. For instance, at least one of the first electrodes and the second electrodes 106 may be positioned between the NDR material 102 and the substrate 110.

According to an example, the relative distances between the first electrode 104 and each of the second electrodes 106 are substantially equivalent to each other such that the same threshold voltage through the first electrode 104 and the second electrodes 106 may be applied to form the conductive channel 120.

Figure 3A:
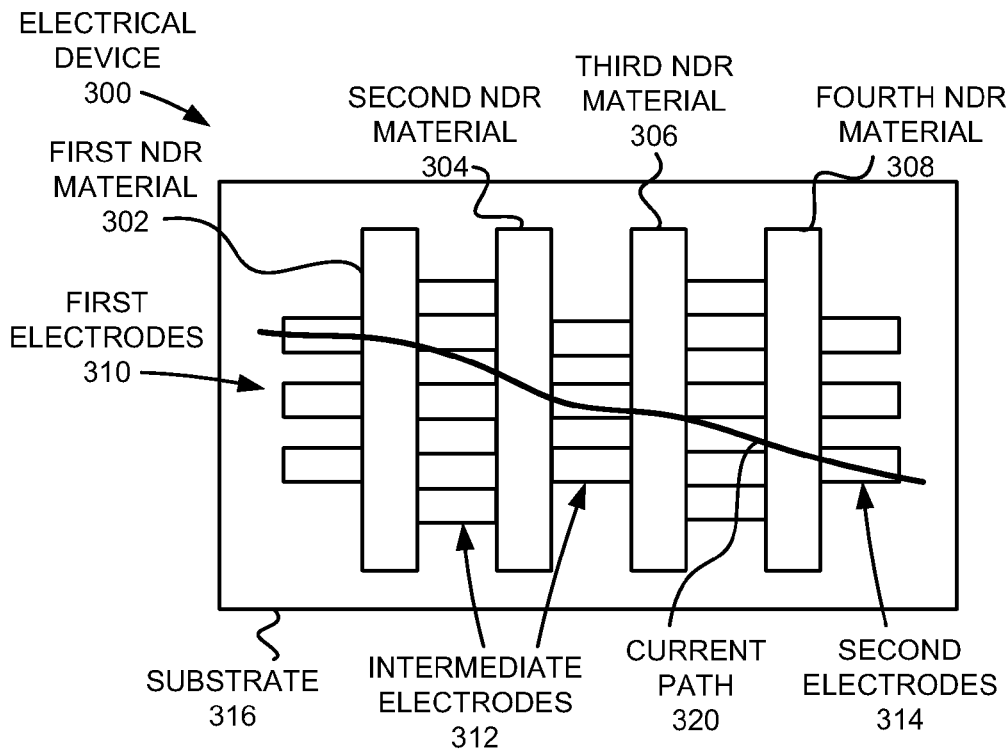
FIGS. 3A and 3B, respectively show block diagrams of electrical devices, according to examples of the present disclosure.
Figure 3B:
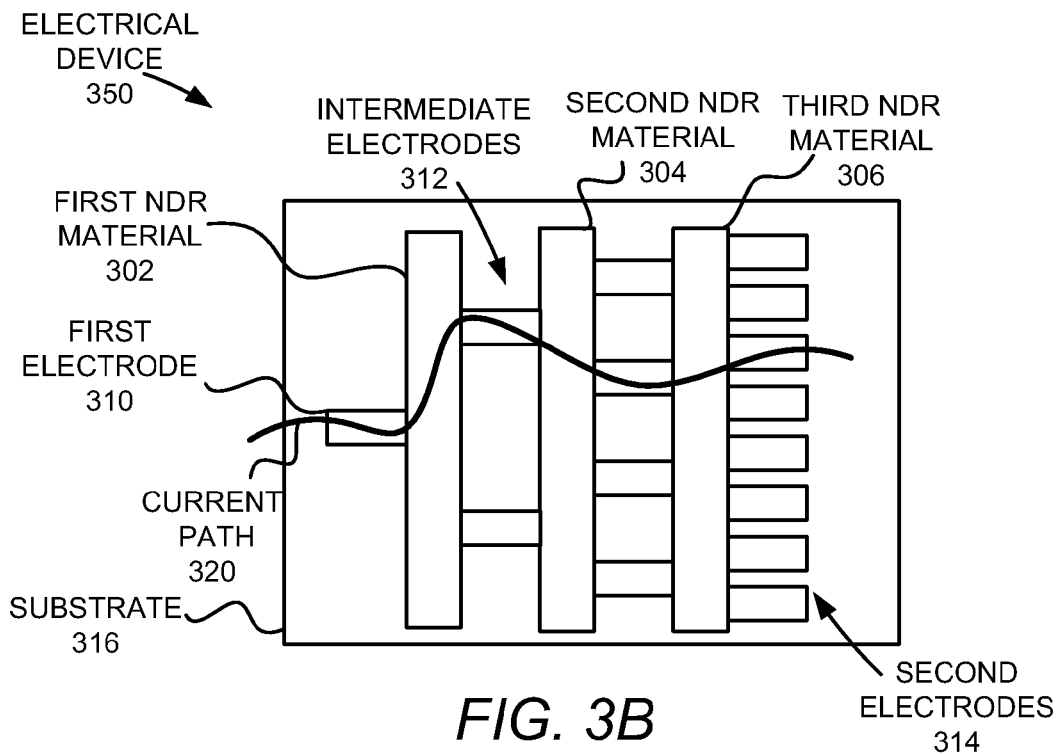

With reference now to FIGS. 3A and 3B, there are shown respective block diagrams of electrical devices 300, 350, according to examples of the present disclosure. It should be understood that the electrical devices 300, 350 depicted in FIGS. 3A and 3B may include additional components and that some of the components described herein may be removed and/or modified without departing from scopes of the electrical devices 300, 350. It should also be understood that the components depicted in FIGS. 3A and 3B are not drawn to scale and thus, the components may have different relative sizes with respect to each other than as shown therein.

Generally speaking, the basic elements of the electrical devices 300, 350 are the electrical circuit component 100 depicted in FIGS. 1A and 1B. In this regard, the electrical devices 300, 350 are configured to operate in many of the same manners as those discussed above with respect to the electrical circuit component depicted FIGS. 1A and 1B. In addition, the electrical devices 300, 350 are to operate to direct the flow of current from a first electrode 310 to a particular second electrode 314 through application of a threshold voltage through the electrical devices 300, 350. The required threshold voltages to form the conductive channels through the electrical devices 300, 350 may comprise the sum of the individual threshold voltages for each of the NDR materials contained in the electrical devices 300, 350.

According to an example, the electrical devices 300, 350 may comprise routers, shifters, multiplexers, etc.

With reference first to FIG. 3A, the electronic device 300 is depicted as including a first NDR material 302, a second NDR material 304, a third NDR material 306, a fourth NDR material 308, a plurality of first electrodes 310, a plurality of intermediate electrodes 312, a plurality of second electrodes 314, and a substrate 316. In addition, a current path 320 is also depicted as being formed through a path between one of the first electrodes 310, particular ones of the intermediate electrodes 312, and one on the second electrodes 314. Thus, for instance, a voltage that exceeds the first predetermined threshold voltage (Vt) 202 for each of the NDR materials 302-308 may have been applied between the selected first electrode 310 and the selected second electrode 314 and conductive channels 120 (not shown) may have been formed in the NDR materials 302-308 along the current path 320. In addition, a voltage that is between the first predetermined threshold voltage Vt 202 and the second predetermined threshold voltage Vt' 204 may be applied through the selected first electrode 310 and the selected second electrode 314 to maintain the current path 320. The intermediate electrodes 312 through which the current path 320 flows may comprise those intermediate electrodes 312 that are located in the path of least resistance and/or the most direct path between the selected first electrode 310 and the selected second electrode 314.

With reference to FIG. 3B, the electrical device 350 is depicted as having all of the same elements as those depicted in the electrical device 300 of FIG. 3A. The electrical device 350 differs from the electrical device 300 in that the electrical device 350 includes a lesser number of NDR materials 302-306 and a lesser number of intermediate electrodes 312, but includes a larger number of second electrodes 314.

Although FIGS. 3A and 3B depict examples of particular electrical device configurations, it should be clearly understood that various other electrical device configurations containing the electrical circuit components 100, 150 may be employed without departing from a scope of the present disclosure. For instance, the electrical devices 300 and 350 may comprise stacked structures in which the electrodes 310-314 and the NDR materials 302-308 are situated in a stacked arrangement.

Figure 4:
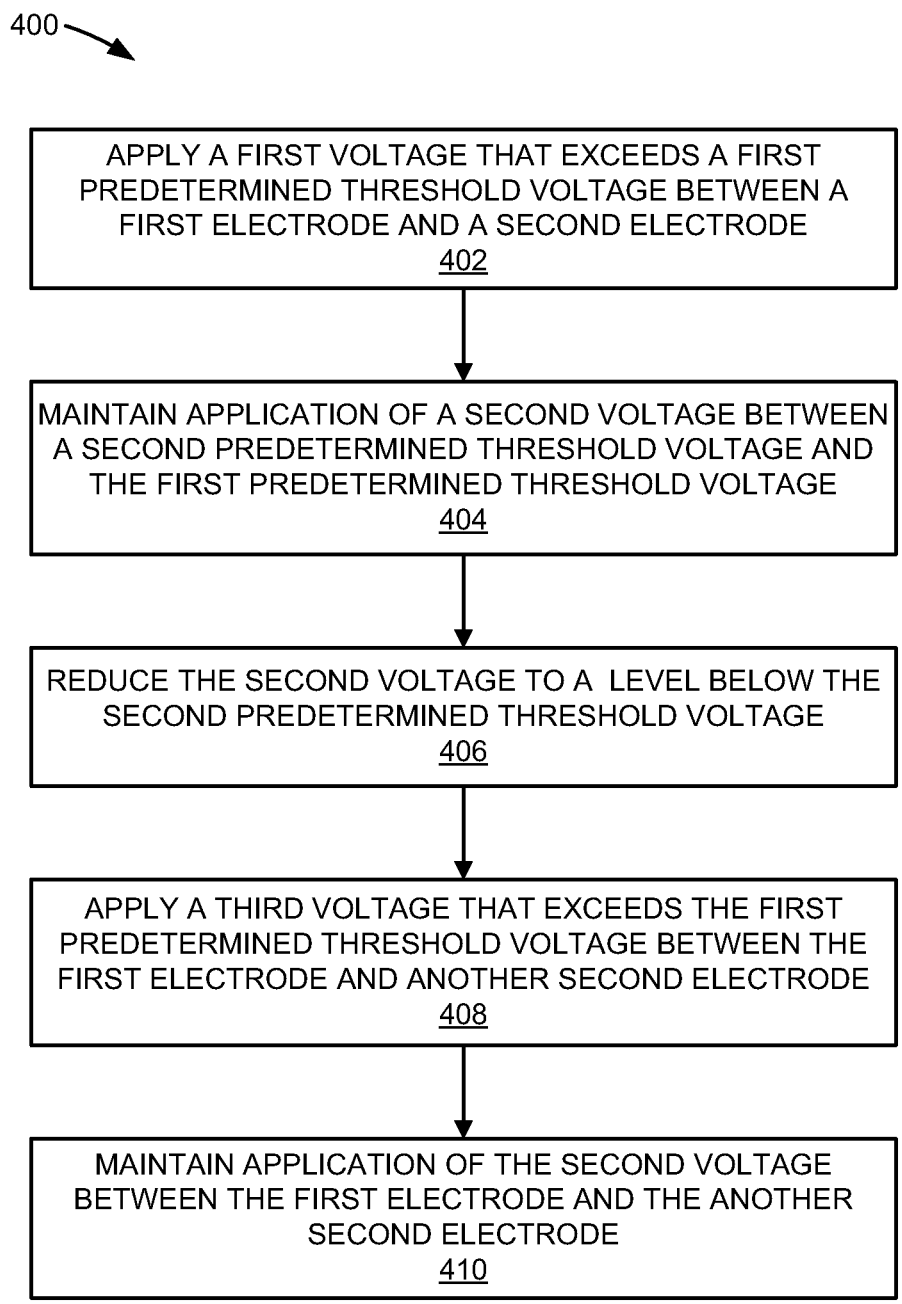
FIG. 4 illustrates a flow diagram of a method of controlling electrical connections in an electrical circuit component having an NDR material connected between a first electrode and a plurality of second electrodes to form a Y-switch, according to an example of the present disclosure.

Turning now to FIG. 4, there is shown a flow diagram of a method 400 of controlling electrical connections in an electrical circuit component having at least one NDR material connected between a first electrode and a plurality of second electrodes to form a Y-switch, according to an example. It should be understood that the method 400 may include additional processes and that some of the processes described herein may be removed and/or modified without departing from a scope of the method 400.

The method 400 is described with particular reference to the electrical circuit component 100 depicted in FIGS. 1A and 1B and the electrical devices 300, 350 depicted in FIGS. 3A and 3B. It should, however, be understood that the method 400 may be implemented in differently configured electrical circuit components and electrical devices.

At block 402, a first voltage that exceeds a first predetermined threshold voltage Vt 202 is applied between the first electrode 104, 310 and a selected one of the plurality of second electrodes 106, 314. In this regard, the selected one of the second electrodes 106, 314 may be addressed by an addressing device (not shown), which causes the first voltage to be applied between the first electrode 104, 310 and the selected one of the second electrodes 106, 314. As discussed above, the at least one NDR material 102, 302-308 undergoes a metal insulator transition to electrically connect the first electrode 104, 310 to the one of the plurality of second electrodes 106, 314 when the threshold voltage is applied between the first electrode 104, 310 and the one of the plurality of second electrodes 106, 314. In addition, for the electrical devices 300, 350, the first predetermined threshold voltage Vt 202 comprises a sum of the predetermined threshold voltages 202 for each of the NDR materials 302-308.

At block 404, application of a second voltage between the first electrode 104, 310 and the one of the plurality of second electrodes 106, 314 through the at least one NDR material 102, 302-308 between a second predetermined threshold voltage (Vt') 204 and the first predetermined threshold voltage (Vt) 202 to communicate a signal between the first electrode 104, 310 and the one of the plurality of second electrodes 106, 314. For the electrical devices 300, 350, the second predetermined threshold voltage Vt' 204 also comprises a sum of the predetermined threshold voltages 204 for each of the NDR materials 302-308.

At block 406, the second voltage applied between the first electrode 104, 310 and the one of the plurality of second electrodes 106, 314 is reduced below the second predetermined threshold voltage (Vt') 204 to remove the electrical connection between the first electrode 104, 310 and the one of the plurality of second electrodes 106, 314. The reduction of the second voltage generally causes the conductive channel 120 in the at least one NDR material 102 between the first electrode 104, 310 and the one of the second electrodes 106, 314 to substantially disappear, thereby removing the electrical connection between these electrodes.

At block 408, a third voltage that exceeds the first predetermined threshold voltage (Vt) 202 is applied between the first electrode 104, 310 and another one of the plurality of second electrodes 106, 314 to turn on the electrical connection between the first electrode 104, 310 and the another one of the plurality of second electrodes 106, 314. In this regard, the selected another one of the second electrodes 106, 314 may be addressed by an addressing device (not shown), which causes the first voltage to be applied between the first electrode 104, 310 and the selected another one of the second electrodes 106, 314.

At block 410, application of the second voltage between the first electrode 104, 310 and the another one of the plurality of second electrodes 106, 314 through the at least one NDR material 102, 302-308 between the second predetermined threshold voltage (Vt') 204 and the first predetermined threshold voltage (Vt) 202 to communicate a signal between the first electrode 104, 310 and the another one of the plurality of second electrodes 106, 314.

In addition, the method 400 may be continuously implemented to vary the communication of signals between a first electrode 104, 310 and the second electrodes 106, 314.

What has been described and illustrated herein are examples of the present disclosure along with some of their variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. An electrical circuit component comprising:
   a first electrode;
   a plurality of second electrodes;
   a negative differential resistance (NDR) material, wherein the first electrode and the plurality of second electrodes are in contact with the NDR material, and wherein the NDR material is to electrically connect the first electrode to one of the plurality of second electrodes when a sufficient voltage is applied between the first electrode and the one of the plurality of second electrodes through the NDR material; and a substrate having a first surface, wherein the first electrode and the plurality of second electrodes are in contact with the first surface and wherein the NDR material is positioned between the first electrode and the plurality of second electrodes.

2. The electrical circuit component according to claim 1, wherein the substrate comprises a material selected from the group consisting of plastic, glass, paper, silicon (Si), gallium arsenide (GaAs), indium phosphide (InP), paper, and other type III-V materials.

3. The electrical circuit component according to claim 1, wherein the NDR material comprises a material selected from the group consisting of vanadium oxide, titanium oxide, manganese oxide, niobium oxide, tungsten oxide, and aluminum oxide.

4. The electrical circuit component according to claim 1, wherein the NDR material is to electrically connect the first electrode to one of the plurality of second electrodes when a first voltage that exceeds a first predetermined threshold voltage is applied between the first electrode and the one of the plurality of second electrodes, wherein the NDR material undergoes a metal-insulator transition to electrically connect the first electrode to the one of the plurality of second electrodes.

5. The electrical circuit component according to claim 4, wherein the NDR material is to electrically disconnect the first electrode from the one of the plurality of second electrodes when a second voltage that falls below a second predetermined threshold voltage is applied between the first electrode and the one of the plurality of second electrodes, wherein the second voltage is relatively lower than the first voltage.

6. The electrical circuit component according to claim 5, wherein the NDR material is further to maintain the electrical connection between the first electrode and the one of the plurality of second electrodes as long as a voltage that exceeds the second predetermined threshold voltage is applied between the first electrode and the one of the plurality of second electrodes.

7. The electrical circuit component according to claim 1, wherein a distance between the first electrode and one of the plurality of second electrodes through the NDR material is substantially equivalent to a distance between the first electrode and the other one of the plurality of second electrodes through the NDR material.

8. An electrical device comprising:
a first electrode;
a plurality of intermediate electrodes;
a plurality of second electrodes;
a first negative differential resistance (NDR) material;
a second NDR material;
wherein the first electrode is in contact with the first NDR material, the plurality of intermediate electrodes are in contact with the first NDR material and the second NDR material, and the plurality of second electrodes are in contact with the second NDR material; and
a substrate having a first surface, wherein the first electrode, the plurality of intermediate electrodes, and the plurality of second electrodes are in contact with the first surface and wherein the first NDR material is positioned between the first electrode and the plurality of intermediate electrodes and the second NDR material is positioned between the plurality of intermediate electrodes and the plurality of second electrodes.

9. The electrical device according to claim 8, wherein the substrate comprises a material selected from the group consisting of plastic, glass, paper, silicon (Si), gallium arsenide (GaAs), indium phosphide (InP), and other type III-V materials.

10. The electrical device according to claim 8, wherein the first NDR material is to electrically connect the first electrode to one of the plurality of intermediate electrodes and the second NDR is to electrically connect the one of the plurality of intermediate electrodes to one of the plurality of second electrodes in response to application of a first voltage that exceeds a first predetermined threshold voltage between the first electrode and the one of the plurality of second electrodes, wherein the first NDR material and the second NDR material undergo a metal insulator transition to electrically connect the first electrode to the one of the plurality of intermediate electrodes and the one of the plurality of intermediate electrodes to the one of the plurality of second electrodes.

11. The electrical device according to claim 10, wherein the first NDR material is to electrically disconnect the first electrode from the one of the plurality of intermediate electrodes and the second NDR material is to electrically disconnect the one of the plurality of intermediate electrodes from the one of the plurality of second electrodes in response to application of a second voltage that falls below a second predetermined threshold voltage between the first electrode and the one of the plurality of second electrodes, wherein the second voltage is relatively lower than the first voltage.

12. The electrical device according to claim 11, wherein the first NDR material and the second NDR material are further to maintain the electrical connection between the first electrode and the one of the plurality of intermediate electrodes and the electrical connection between the one of the plurality of intermediate electrodes and the one of the plurality of second electrodes as long as a voltage that exceeds the second predetermined threshold voltage is applied between the first electrode and the one of the plurality of second electrodes.

13. The electrical device according to claim 8, wherein the first NDR material and the second NDR material comprise a material selected from the group consisting of vanadium oxide, titanium oxide, manganese oxide, niobium oxide, tungsten oxide, and aluminum oxide.

14. An electrical circuit component comprising:
a first electrode;
a plurality of second electrodes; and
a negative differential resistance (NDR) material having a first surface, wherein the first electrode and the plurality of second electrodes are in contact with the first surface of the NDR material such that the first electrode is co-planar with the plurality of second electrodes along the first surface of the NDR material, and wherein the NDR material is to electrically connect the first electrode to one of the plurality of second electrodes when a sufficient voltage is applied between the first electrode and the one of the plurality of second electrodes through the NDR material.

15. The electrical circuit component according to claim 14, further comprising a substrate, wherein the NDR material is positioned on the substrate on a surface opposite the first surface, and wherein the substrate comprises a material selected from the group consisting of plastic, glass, paper, silicon (Si), gallium arsenide (GaAs), indium phosphide (InP), paper, and other type III-V materials.

16. The electrical circuit component according to claim 14, wherein the NDR material comprises a material selected from the group consisting of vanadium oxide, titanium oxide, manganese oxide, niobium oxide, tungsten oxide, and aluminum oxide.

17. A method of controlling electrical connections in an electrical circuit component having a first electrode, a plurality of second electrodes, at least one negative differential resistance (NDR) material, wherein the first electrode and the plurality of second electrodes are in contact with the NDR material, and wherein the NDR material is to electrically connect the first electrode to one of the plurality of second electrodes when a sufficient voltage is applied between the first electrode and the one of the plurality of second electrodes through the NDR material, and a substrate having a first surface, wherein the first electrode and the plurality of second electrodes are in contact with the first surface and wherein the NDR material is positioned between the first electrode and the plurality of second electrodes, said method comprising:
applying a first voltage that exceeds a first predetermined threshold voltage between the first electrode and one of the plurality of second electrodes, wherein the NDR material undergoes a metal insulator transition to electrically connect the first electrode to the one of the plurality of second electrodes; and
maintaining application of a second voltage between the first electrode and the one of the plurality of second electrodes through the NDR material between a second predetermined threshold voltage and the first predetermined threshold voltage to communicate a signal between the first electrode and the one of the plurality of second electrodes.

18. The method according to claim 17, further comprising:
reducing the second voltage applied between the first electrode and the one of the plurality of second electrodes below the second predetermined threshold voltage to remove the electrical connection between the first electrode and the one of the plurality of second electrodes.

19. The method according to claim 18, further comprising:
applying a third voltage that exceeds the first predetermined threshold voltage between the first electrode and another one of the plurality of second electrodes to turn on the electrical connection between the first electrode and the another one of the plurality of second electrodes.

20. The method according to claim 19, further comprising:
maintaining application of the second voltage between the first electrode and the another one of the plurality of second electrodes through the NDR material between the second predetermined threshold voltage and the first predetermined threshold voltage to communicate a signal between the first electrode and the another one of the plurality of second electrodes.

21. The method according to claim 17, wherein the electrical circuit further has a plurality of intermediate electrodes and another NDR material, wherein the first electrode is connected to the NDR material, the plurality of intermediate electrodes are connected to the NDR material and the another NDR material, and the plurality of second electrodes are connected to the another NDR material, said method further comprising:
applying a first voltage that exceeds a first predetermined threshold voltage between the first electrode and one of the plurality of second electrodes, wherein the NDR material and the another NDR material undergo a metal-insulator transition to electrically connect the first electrode to one of the plurality of intermediate electrodes and to electrically connect the one of the intermediate electrodes to one of the plurality of second electrodes; and
maintaining application of a voltage between the first electrode and the one of the plurality of second electrodes through the NDR material and the another NDR material between a second predetermined threshold voltage and the first predetermined threshold voltage to communicate a signal between the first electrode and the one of the plurality of second electrodes.

* * * * *